(12) United States Patent
Choi et al.

(10) Patent No.: US 7,863,628 B2
(45) Date of Patent: Jan. 4, 2011

(54) LIGHT-EMITTING DEVICE AND LIGHT-RECEIVING DEVICE USING TRANSISTOR STRUCTURE

(75) Inventors: Byoung Lyong Choi, Seoul (KR); Kyung Sang Cho, Gwacheon-si (KR); Eun Kyung Lee, Suwon-si (KR); O Gweon Seo, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 183 days.

(21) Appl. No.: 12/031,287

(22) Filed: Feb. 14, 2008

(65) Prior Publication Data

US 2009/0008628 A1 Jan. 8, 2009

(30) Foreign Application Priority Data

Jul. 4, 2007 (KR) .................. 10-2007-0067032

(51) Int. Cl.
 *H01L 27/15* (2006.01)
(52) U.S. Cl. .............. 257/86; 257/13; 257/40; 257/79; 257/431; 345/82
(58) Field of Classification Search ........ 257/13, 257/40, 79, 86, 431; 345/82
 See application file for complete search history.

(56) References Cited

U.S. PATENT DOCUMENTS

| | | | |
|---|---|---|---|
| 6,720,572 B1* | 4/2004 | Jackson et al. | 257/40 |
| 7,365,360 B2* | 4/2008 | Kang et al. | 257/40 |
| 2004/0082098 A1* | 4/2004 | Schmid | 438/99 |
| 2004/0258956 A1* | 12/2004 | Matsusue | 428/690 |
| 2005/0247924 A1 | 11/2005 | Atwater et al. | |
| 2006/0208251 A1* | 9/2006 | Yoshizawa | 257/40 |
| 2007/0257251 A1* | 11/2007 | Liu et al. | 257/40 |
| 2008/0197344 A1* | 8/2008 | Yano et al. | 257/40 |
| 2008/0217602 A1* | 9/2008 | Kahen | 257/13 |

FOREIGN PATENT DOCUMENTS

| | | |
|---|---|---|
| KR | 10-20040077813 | 9/2004 |
| KR | 10-20050058525 | 6/2005 |

OTHER PUBLICATIONS

S.M. Sze "Semiconductor Devices. Physics and Technology. 2nd Edition", © 2002 John Wiley and Sons, p. 282.*

(Continued)

*Primary Examiner*—N Drew Richards
*Assistant Examiner*—Yu-Hsi Sun
(74) *Attorney, Agent, or Firm*—Cantor Colburn LLP

(57) ABSTRACT

Disclosed is a light-emitting device using a transistor structure, including a substrate, a first gate electrode, a first insulating layer, a source electrode, a drain electrode, and a light-emitting layer formed between the source electrode and the drain electrode in a direction parallel to these electrodes. In the light-emitting device using the transistor structure, it is possible to adjust the mobility of electrons or holes and to selectively set a light-emitting region through the control of the magnitude of voltage applied to the gate electrode, thus increasing the lifespan of the light-emitting device, facilitating the manufacturing process thereof, and realizing light-emitting or light-receiving properties having high efficiency and high purity.

16 Claims, 5 Drawing Sheets

OTHER PUBLICATIONS

Davis et al. "Large magnetic film effects in organic light emitting diodes based on tris (8-hydroxyquinoline aluminum( (Alq3)/N,N'-di(naphtalen-1-yl)-N,N'diphenil-benzidin (NPB) bilayers" - J of Vacuum, Science and Technology. A: Vacuum, Surfaces, and Films, v. 22, issue 4, Jul. 2004, pp. 1885-1891.*

M. Leclerc, J. Polymer Sci., Part A, v. 39, issue 17 (2001).*

Korean Office Action with English translation which corresponds to PCT/US2003/030647 and Korean Patent Publication No. 2004-0077813 dated Jun. 23, 2008.

* cited by examiner

LIGHT-EMITTING DEVICE AND LIGHT-RECEIVING DEVICE USING TRANSISTOR STRUCTURE

PRIORITY STATEMENT

This non-provisional application claims priority under U.S.C. §119 from Korean Patent Application No. 10-2007-0067032, filed Jul. 4, 2007 with the Korean Intellectual Property Office (KIPO), the entire contents of which are herein incorporated by reference.

BACKGROUND

1. Field

Example embodiments relate to a light-emitting device and a light-receiving device using a transistor structure, and more particularly, to a light-emitting device and a light-receiving device using a transistor structure, in which a light-emitting layer, an electron-transporting layer, and a hole-transporting layer are provided between the source electrode and the drain electrode of a transistor in a direction parallel to these electrodes, thereby increasing the lifespan of the device, facilitating the manufacturing process thereof, and realizing light-emitting and light-receiving properties having high efficiency and high purity.

2. Description of the Related Art

In general, an electroluminescent device is a device using a phenomenon by which light is emitted when an electric field is applied to a predetermined material, in which electrons and holes are injected to a light-emitting layer, form excitons and are then recombined, thus emitting light. For the driving of the device, the driving of a transistor is mainly employed in order to decrease the size of the device and increase the efficiency thereof.

However, because the light-emitting portion of the device and the portion of the transistor that drives it are formed independently of each other, there are problems in that the overall size of the device is increased and the manufacturing process thereof is not easy. In recent years, research towards a light-emitting device in which the light-emitting portion and the driving portion are integrated with each other has been conducted.

US Publication No. 2005-0247924 discloses a light-emitting device using continuously charged nanocrystals, in particular, a light-emitting device having a transistor structure, which includes a substrate, a source, a drain, a channel portion, gate oxide, and a gate electrode. When the above light-emitting device, including one or more Si nanocrystals in the gate oxide, is subjected to alternating-current (AC) driving, electrons and holes, which are injected from the gate electrode, meet together and form excitons, consequently emitting light. Although this device has a structure in which the light-emitting portion and the transistor, as the driving portion are integrated with each other, it has neither a hole-transporting layer nor an electron-transporting layer, undesirably making it difficult to effectively inject the holes and electrons. Furthermore, it is impossible to selectively set the light-emitting region through the control of the magnitude of the electric field that is applied to the gate electrode, undesirably decreasing the lifespan of the device.

SUMMARY

Accordingly, example embodiments have been devised keeping in mind the above problems occurring in the related art, and provide a light-emitting device using a transistor structure, which includes a substrate, a first gate electrode, a first insulating layer, a source electrode, a drain electrode, and a light-emitting layer formed between the source electrode and the drain electrode in a direction parallel to these electrodes, so that it is possible to adjust the mobility of electrons or holes and to selectively set a light-emitting region, through the control of the magnitude of the voltage that is applied to the gate electrode, thus increasing the lifespan of the light-emitting device, facilitating the manufacturing process thereof, and realizing light-emitting properties having high efficiency and high purity.

Example embodiments provide an electronic device, for example, a display device, an illumination system, a backlight unit, and a surface emission device, including the light-emitting device using the transistor structure.

Example embodiments provide a light-receiving device using a transistor structure, which includes a substrate, a first gate electrode, a first insulating layer, a source electrode, a drain electrode, and a light-receiving layer formed between the source electrode and the drain electrode in a direction parallel to these electrodes.

According to the example embodiments, a light-emitting device using a transistor structure may include a substrate, a first gate electrode, a first insulating layer, a source electrode, a drain electrode, and a light-emitting layer formed between the source electrode and the drain electrode in a direction parallel to these electrodes.

According to the example embodiments, an electronic device, for example, a display device, an illumination system, a backlight unit, or a surface emission device, may include the light-emitting device using the transistor structure.

According to the example embodiments, a light-receiving device using a transistor structure may include a substrate, a first gate electrode, a first insulating layer, a source electrode, a drain electrode, and a light-receiving layer formed between the source electrode and the drain electrode in a direction parallel to these electrodes.

BRIEF DESCRIPTION OF THE DRAWINGS

Example embodiments will be more clearly understood from the following detailed description, taken in conjunction with the accompanying drawings.

FIG. 1 is a schematic sectional view illustrating a light-emitting device using a transistor structure, according to a first example embodiment;

FIG. 2 is a schematic sectional view illustrating a light-emitting device using a transistor structure, according to a second example embodiment;

FIG. 3 is a schematic sectional view illustrating a light-emitting device using a transistor structure, according to a third example embodiment;

FIG. 4 is a schematic sectional view illustrating a light-emitting device using a transistor structure, according to a fourth example embodiment;

FIG. 5 is a schematic sectional view illustrating a light-emitting device using a transistor structure, according to a fifth example embodiment;

FIG. 6 is a sectional view illustrating the operation of the light-emitting device using a transistor structure of FIG. 5;

FIG. 7 is a schematic sectional view illustrating a light-emitting device using a transistor structure, according to a sixth example embodiment;

FIG. 8 is a sectional view illustrating the operation of the light-emitting device using a transistor structure of FIG. 7;

FIG. 9 is a schematic sectional view illustrating a light-emitting device using a transistor structure, according to a seventh example embodiment; and FIG. 10 is a schematic sectional view illustrating a light-emitting device using a transistor structure, according to an eighth example embodiment.

It should be noted that these figures are intended to illustrate the general characteristics of methods, structures and/or materials utilized in certain example embodiments and to supplement the written description provided below. These drawings are not, however, to scale, and may not precisely reflect the precise structural or performance characteristics of any given embodiment, and should not be interpreted as defining or limiting the range of values or properties encompassed by the example embodiments. In particular, the relative thicknesses and positioning of molecules, layers, regions and/or structural elements may be reduced or exaggerated for clarity. The use of similar or identical reference numbers in the various drawings is intended to indicate the presence of analogous or identical elements or features.

DESCRIPTION OF THE PREFERRED EMBODIMENTS

Hereinafter, a detailed description will be given of example embodiments with reference to the appended drawings.

A conventional organic light-emitting device is structured in a manner such that an electron-injecting electrode, an electron-transporting layer, a light-emitting layer, a hole-transporting layer, and a hole-injecting electrode are sequentially formed, in which the electron-injecting electrode or the hole-injecting electrode is formed perpendicular to the other layers. Thus, in order to adjust the amount of injection of electrons or holes, the thickness or properties (mobility or band gap) of the electron-transporting layer or hole-transporting layer should be controlled.

However, according to the example embodiments, a light-emitting device using a transistor structure has a novel structure in which a light-emitting layer, an electron-transporting layer and a hole-transporting layer are provided as the channel portion of the transistor structure, such that electrons or holes may be injected in a direction parallel to the electron-transporting layer or hole-transporting layer, thus making it easy to inject the electrons or holes, without the need to limit the thickness or properties of the electron-transporting layer or hole-transporting layer. This may be realized through the control of the magnitude of voltage that is applied to the gate electrode.

The light-emitting device using a transistor structure, according to the example embodiments, includes a substrate, a first gate electrode, a first insulating layer, a source electrode, a drain electrode, and a light-emitting layer formed between the source electrode and the drain electrode in a direction parallel to these electrodes.

Figure 1:
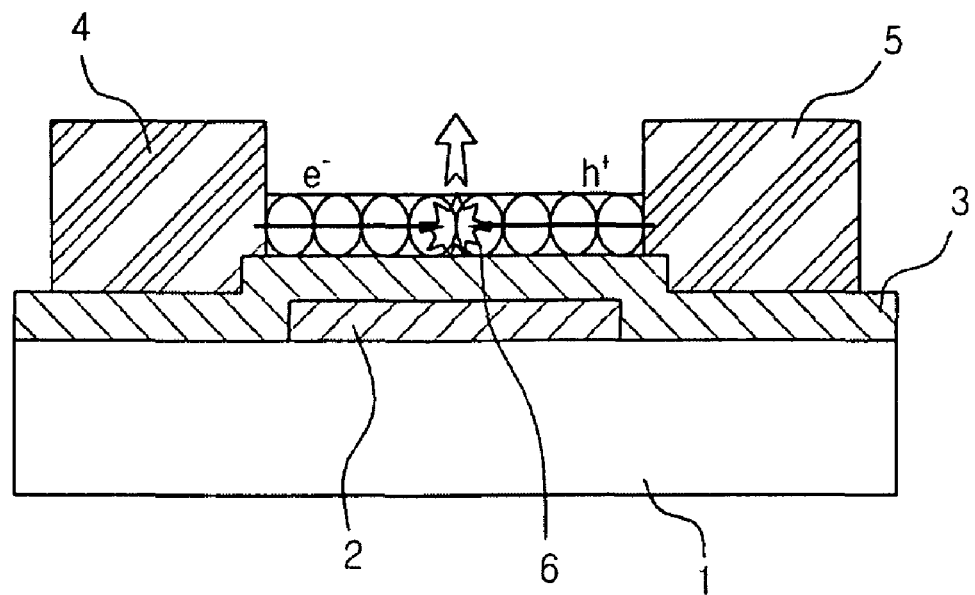
FIGS. 1-10 represent non-limiting example embodiments described herein.

FIG. 1 illustrates a light-emitting device using a transistor structure according to a first example embodiment.

Referring to FIG. 1, in the light-emitting device using the transistor structure, which includes a substrate 1, a first gate electrode 2, a first insulating layer 3, a source electrode 4, and a drain electrode 5, a light-emitting layer 6 may be formed between the source electrode 4 and the drain electrode 5, where a channel is typically formed, in a direction parallel to these electrodes.

In this light-emitting device, when the light-emitting layer 6 is formed between the source electrode 4 and the drain electrode 5 in the direction parallel to these electrodes, it is possible to adjust the mobility of electrons or holes and to selectively set the light-emitting region through the control of the magnitude of voltage that is applied to the gate electrode, thereby obtaining a light-emitting device having an extended lifespan and light-emitting properties of high efficiency and high purity.

Such a light-emitting device may be directly manufactured on a transistor device, and thus, it may be applied in an unchanged state to a conventional transistor production process while decreasing the demand for additional circuits or chips required for the driving of the device. Accordingly, upon mass production, a conventional semiconductor equipment process may be used unchanged.

The light-emitting layer 6 may be formed of an organic light-emitting material, and examples of the organic light-emitting material include, but are not limited to, rubrene, anthracene, perylene, coumarin 6, Nile Red, aromatic diamine, TPD (N,N'-diphenyl-N,N'-bis-(3-methylphenyl)-1,1'-biphenyl-4,4'-diamine), DCM (dicyanomethylene-2-methyl-6-(p-dimethylaminostyryl) H-pyran) or derivatives thereof, polyparaphenylenevinylene-based derivatives, polythiophene-based derivatives, polyparaphenylene-based derivatives, and polyfluorene-based derivatives.

Further, the light-emitting layer 6 may be a quantum-dot light-emitting layer. The quantum dots have excellent light-emitting efficiency and color purity, and thus exhibit light-emitting properties superior to those of conventional light-emitting sources, and as well, the thermal stability of inorganic material itself is good, therefore improving the stability and lifespan of the device.

Examples of the quantum dots usable as the material for the light-emitting layer include, but are not limited to, Group II-VI compound semiconductor nanocrystals, Group III-V compound semiconductor nanocrystals, Group IV-VI compound semiconductor nanocrystals, Group TV compound semiconductor nanocrystals, and mixtures thereof.

Examples of the Group II-VI compound semiconductor nanocrystals include, but are not limited to, binary compounds, including CdSe, CdTe, ZnS, ZnSe, and ZnTe, ternary compounds, including CdSeS, CdSeTe, CdSTe, ZnSeS, ZnSeTe, ZnSTe, CdZnS, CdZnSe, and CdZnTe, and quaternary compounds, including CdZnSeS, CdZnSeTe, CdZnSTe, CdHgSeS, CdHgSeTe, CdHgSTe, HgZnSeS, HgZnSeTe, and HgZnSTe.

Examples of the Group III-V compound semiconductor nanocrystals include, but are not limited to, binary compounds, including GaN, GaP, GaAs, GaSb, InP, InAs, and InSb, ternary compounds, including GaNP, GaNAs, GaNSb, GaPAs, GaPSb, InNP, InNAs, InNSb, InPAs, InPSb, and GaAlNP, and quaternary compounds, including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb.

Examples of the Group IV-VI compound semiconductor nanocrystals include, but are not limited to, binary compounds, including PbS, PbSe, and PbTe, ternary compounds, including PbSeS, PbSeTe, PbSTe, SnPbS, SnPbSe, and SnPbTe, and quaternary compounds, including SnPbSSe, SnPbSeTe, and SnPbSTe.

Examples of the Group IV compound semiconductor nanocrystals include, but are not limited to, unary compounds, including Si and Ge, and binary compounds, including SiC and SiGe.

The light-emitting layer 6 may be provided in the form of a mixture of quantum dots and bipolar material. When the quantum dots, having insulating properties, are used alone, it is difficult to effectively inject the electrons or holes. However, when the quantum dots are mixed with the bipolar material, the efficiency with which the electrons and holes are transported from the source electrode and the drain electrode may be increased, thereby improving the light-emitting efficiency of the light-emitting device.

As illustrated in FIG. 1, the light-emitting layer 6, formed between the source electrode 4 and the drain electrode 5, functions as the channel portion of the transistor. When voltage is applied to the first gate electrode 2, electrons are injected from the source electrode 4 to the light-emitting layer 6, and holes are injected from the drain electrode 5 to the light-emitting layer 6, thus forming excitons, after which recombination of the electrons and holes occurs, thereby emitting light in the direction of the arrow.

Examples of the bipolar material include, but are not limited to, bipolar monomers, including copper phthalocyanine, and bipolar polymers, including polyaniline.

Examples of the substrate 1 typically useful in a transistor include, but are not limited to, a glass substrate, a silicon substrate, or a plastic substrate.

In the light-emitting device using the transistor structure, examples of the material for the first gate electrode 2 include, but are not limited to, Al, Au, Ag, In, Sn, Mg, Ca, Pt, Ba, Ni, and compounds thereof.

Examples of the material for the source electrode 4 and the drain electrode 5 include, but are not limited to, Ti, Pd, Cr, Al, Au, Ag, In, Sn, Mg, Ca, Pt, Ba, Ni, Zn, and compounds thereof.

According to a second example embodiment, the light-emitting device may further include an electron-transporting layer or a hole-transporting layer on the light-emitting layer. Such a light-emitting device is illustrated in FIG. 2.

Figure 2:
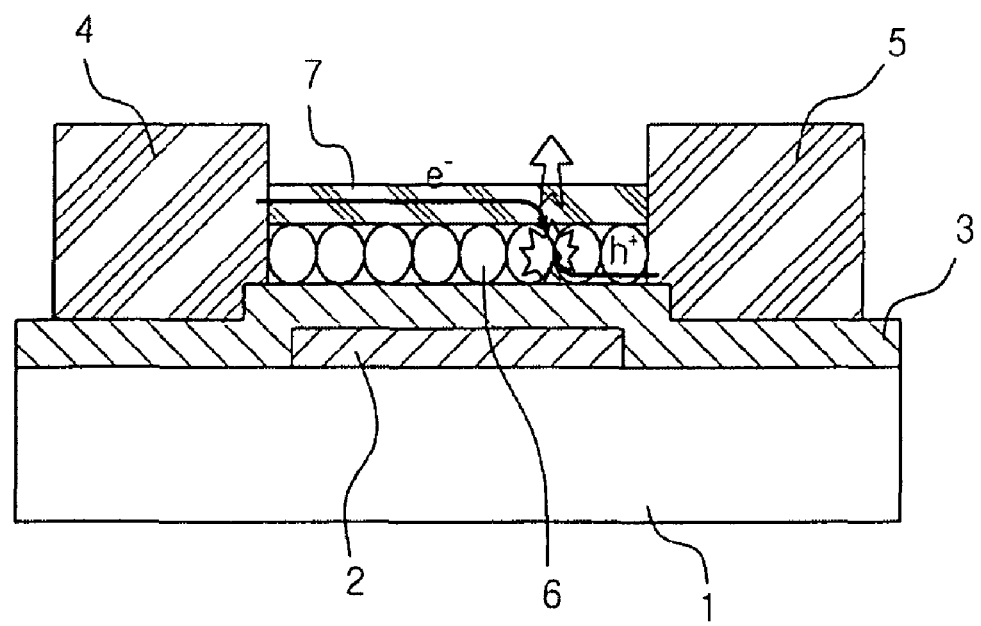

Referring to FIG. 2, in the light-emitting device using the transistor structure, which includes a substrate 1, a first gate electrode 2, a first insulating layer 3, a source electrode 4, and a drain electrode 5, a light-emitting layer 6 may be formed between the source electrode 4 and the drain electrode 5 in a direction parallel to these electrodes, and furthermore, an electron-transporting layer 7 may be provided on the light-emitting layer 6.

The electron-transporting layer 7 may be formed of any material that is able to effectively transport electrons, and examples of the material therefor include, but are not limited to, metal oxide, including $TiO_2$, $ZnO$, $SiO_2$, $SnO_2$, $WO_3$, $ZrO_2$, $HfO_2$, $Ta_2O_5$, $BaTiO_3$, $BaZrO_3$, $Al_2O_3$, $Y_2O_3$ and $ZrSiO_4$, and semiconductors having a band gap of 2.4 eV or more, including CdS, ZnSe and ZnS.

In the device having the above structure, electrons are transported from the source electrode 4 to the drain electrode 5, and holes are injected from the drain electrode 5 to the light-emitting layer 6. As such, when positive voltage is applied to the first gate electrode 2, the electrons in the course of being transported from the source electrode 4 to the drain electrode 5 may be pushed toward the first gate electrode 2, and may thus be injected to the light-emitting layer 6. Thereby, in the light-emitting layer 6, the electrons and holes form excitons and are then recombined, thus emitting light in the direction of the arrow.

As such, because the electrons move through the electron-transporting layer 7 faster than the holes move through the light-emitting layer 6, the light-emitting region may be formed near the drain electrode 5 to which holes are injected. In this case, a quenching phenomenon, in which the excited excitons are discharged again to the drain electrode 5, occurs, undesirably decreasing efficiency. In the case where the magnitude of voltage that is applied to the first gate electrode 2 is increased, electrons may be rapidly injected to the light-emitting layer 6 from the electron-transporting layer 7, functioning as the channel portion, so that the light-emitting region may be formed at the portion further away from the drain electrode 5, thereby preventing the quenching phenomenon.

In the light-emitting device using the transistor structure according to the example embodiments, the light-emitting region may be selectively set through the control of the magnitude of the voltage that is applied to the first gate electrode 2. That is, the recombination zone of the electrons and holes may be defined as a predetermined region using the electric field of the gate electrode 2, thereby making it possible to selectively set the light-emitting region. As well, overcurrent flowing in the circuit itself may be removed, thus realizing stable circuit driving.

According to the modification of the second example embodiment, in the device illustrated in FIG. 2, a hole-transporting layer may be provided in place of the electron-transporting layer 7. In this case, the holes in the course of being injected from the drain electrode to the hole-transporting layer may be pushed and injected to the light-emitting layer by the voltage applied to the first gate electrode, and thus meet the electrons injected from the source electrode. Such holes and electrons form excitons and are then recombined, thereby emitting light. Unlike when using the electron-transporting layer, because the mobility of holes is faster than the mobility of electrons, the light-emitting region may be formed near the source electrode. Likewise, in this way, the light-emitting region may be selectively set through the control of the magnitude of the voltage applied to the gate electrode.

According to a third example embodiment, the light-emitting device using a transistor structure may further include an electron-transporting layer or a hole-transporting layer between the first insulating layer and the light-emitting layer. Such a light-emitting device is illustrated in FIG. 3.

Figure 3:
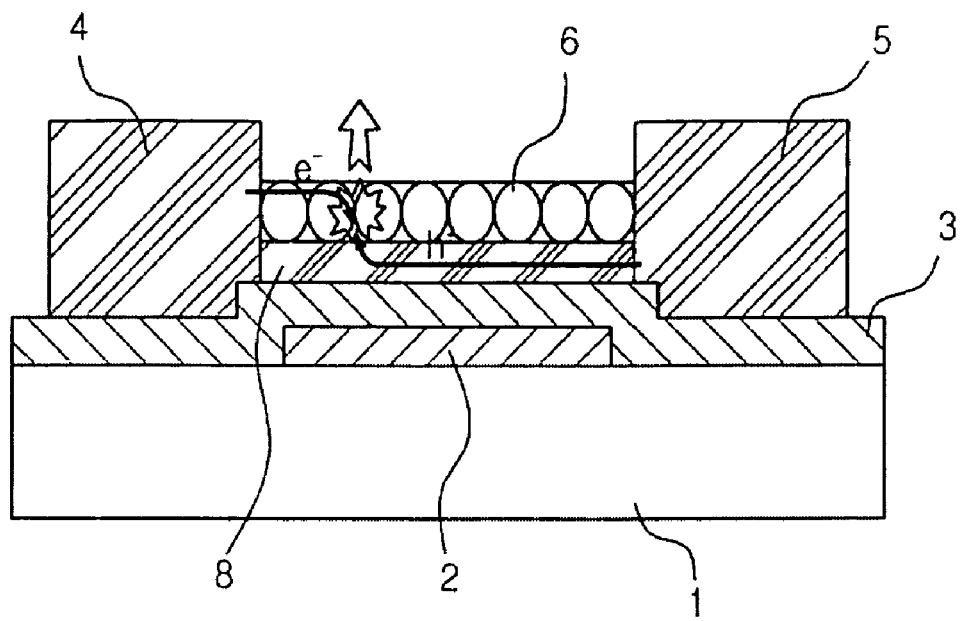

Referring to FIG. 3, in the light-emitting device using the transistor structure, which includes a substrate 1, a first gate electrode 2, a first insulating layer 3, a source electrode 4, and a drain electrode 5, a light-emitting layer 6 may be formed between the source electrode 4 and the drain electrode 5 in a direction parallel to these electrodes, and furthermore, a hole-transporting layer 8 may be formed between the first insulating layer 3 and the light-emitting layer 6.

The hole-transporting layer 8 may be formed of material chosen in consideration of process facilitation and reliability in order to effectively inject the holes.

Examples of the material for the hole-transporting layer 8 of the light-emitting device using the transistor structure according to the example embodiments include, but are not limited to, poly(3,4-ethylenedioxythiophene) (PEDOT)/pblystyrene parasulfonate (PSS), polyphenylenevinylelle, polyparaphenylene, polymethacrylate, poly(9,9-octylfluorene), poly(spiro-fluorene), N,N'-diphenyl-N,N'-bis 3-methylphenyl-1,1'-biphenyl-4,4'-diammine (TPD), N,N'-di(naphthalen-1-yl)-N-N'-diphenyl-benzidine, tris(3-methylphenylphenylamino)-triphenylamine (m-MTDATA), poly 9,9'-dioctylfluorene-co-N-(4-butylphenyl)diphenylamine (TFB), copper phthalocyanine, polyvinylcarbazole (PVK) and derivatives thereof, starburst-based material, metal oxide, including $TiO_2$, $ZnO$, $SiO_2$, $SnO_2$, $WO_3$, $ZrO_2$, $HfO_2$, $Ta_2O_5$, $BaTiO_3$, $BaZrO_3$, $Al_2O_3$, $Y_2O_3$ and $ZrSiO_4$, and semiconductors including CdS, ZnSe, and ZnS.

The hole-transporting layer 8 may be formed using a material doped with a dopant in order to prepare a p-type material. For instance, as the hole-transporting layer, ZnO, doped using nitrogen as a dopant, may be used, but the present invention is not limited thereto. In this case, the hole-transporting performance of the hole-transporting layer 8 may be enhanced.

In such a light-emitting device, holes are transported from the drain electrode 5, through the hole-transporting layer 8, to the source electrode 4, and electrons are injected from the source electrode 4 to the light-emitting layer 6. When positive voltage is applied to the first gate electrode 2, the holes in the course of being transported from the drain electrode 5 to the source electrode 4 may be pushed toward the light-emitting layer 6, and thus may be injected to the light-emitting layer 6. Thereby, in the light-emitting layer 6, the electrons and holes form excitons and are then recombined, therefore emitting light in the direction of the arrow.

Even in this case, the light-emitting region may be selectively set through the control of the magnitude of voltage applied to the first gate electrode 2.

According to the modification of the third example embodiment, in the device illustrated in FIG. 3, an electron-transporting layer may be provided in place of the hole-transporting layer 8. In this case, electrons in the course of being injected from the source electrode to the electron-transporting layer may be pushed and injected to the light-emitting layer by the voltage applied to the first gate electrode, and thus meet the holes injected from the drain electrode. Such electrons and holes form excitons and are then recombined, thereby emitting light. Through the control of the magnitude of the voltage applied to the gate electrode, the light-emitting region may be selectively set.

According to a fourth example embodiment, the light-emitting device using a transistor structure may further include an electron-transporting layer or a hole-transporting layer at one side of the light-emitting layer, and also a hole-transporting layer or an electron-transporting layer between the first insulating layer and the light-emitting layer. Such a light-emitting device is illustrated in FIG. 4.

Figure 4:
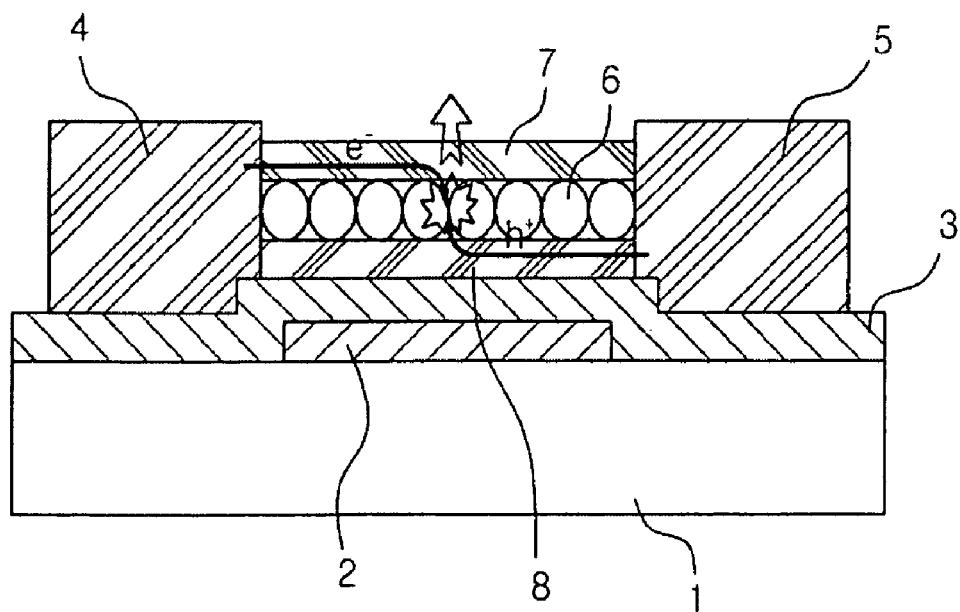

Referring to FIG. 4, in the light-emitting device using the transistor structure, which includes a substrate 1, a first gate electrode 2, a first insulating layer 3, a source electrode 4, and a drain electrode 5, a hole-transporting layer 8, a light-emitting layer 6, and an electron-transporting layer 7 may be sequentially formed between the source electrode 4 and the drain electrode 5 in a direction parallel to these electrodes.

In this light-emitting device, the mobility of electrons is similar to the mobility of holes, and thus light emission occurs in the direction of the arrow at the center portion of the light-emitting layer 6. When positive voltage is applied to the first gate electrode 2 and the magnitude thereof is increased, the holes in the course of moving from the drain electrode 5, through the hole-transporting layer 8, to the source electrode 4, may be pushed and injected to the light-emitting layer 6 near the drain electrode 5, and the electrons in the course of moving from the source electrode 4, through the electron-transporting layer 7, to the drain electrode 5, may be moved further away due to the effect of the electric field of the gate electrode 2, and may then be injected to the light-emitting layer 6. Thereby, the light-emitting region may be set near the drain electrode 5.

According to a fifth example embodiment, the light-emitting device using a transistor structure may further include a second insulating layer formed on the electron-transporting layer or hole-transporting layer on the light-emitting layer, and a second gate electrode formed on the second insulating layer. Such a light-emitting device is illustrated in FIG. 5.

Figure 5:
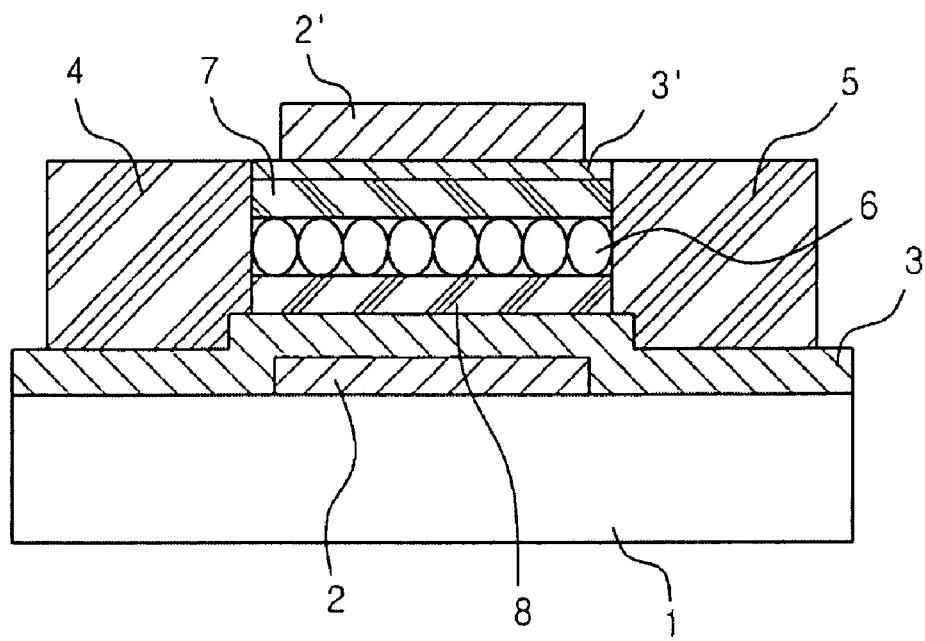

Referring to FIG. 5, in the light-emitting device using the transistor structure, which includes a substrate 1, a first gate electrode 2, a first insulating layer 3, a source electrode 4, and a drain electrode 5, a hole-transporting layer 8, a light-emitting layer 6, an electron-transporting layer 7, and a second insulating layer 3' may be sequentially formed between the source electrode 4 and the drain electrode 5 in a direction parallel to these electrodes, and a second gate electrode 2' may be formed on the second insulating layer 3'.

The second gate electrode 2' is used to enhance the function of the first gate electrode 2 for selectively setting the light-emitting region of the light-emitting device, and should be provided in the form of a transparent electrode in the direction of emission of light.

Examples of the material for the second gate electrode 2' include, but are not limited to, ITO (Indium Tin Oxide), IZO (Indium Zinc Oxide), FTO, nickel (Ni), platinum (Pt), gold (Au), silver (Ag), iridium (Ir), oxides thereof, and mixtures thereof.

Figure 6:
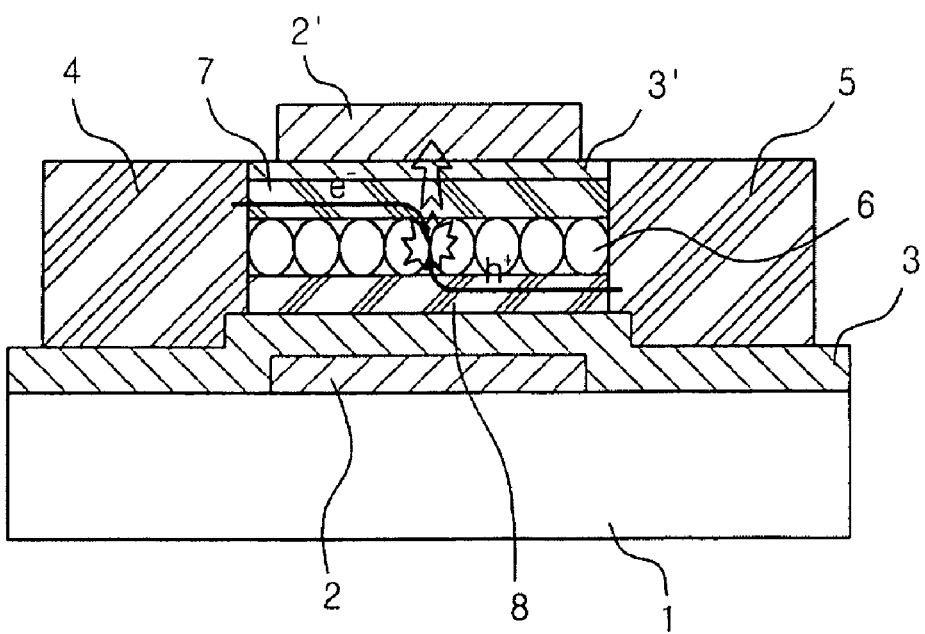

FIG. 6 illustrates the operation of the device of FIG. 5. Referring to FIG. 6, the electrons moving through the electron-transporting layer 7 and the holes moving through the hole-transporting layer 8 are injected to the light-emitting layer 6 due to the effect of the electric field applied to the first gate electrode 2 and the second gate electrode 2', thus realizing light emission in the direction of the arrow. As such, as mentioned above, the light-emitting region may be selectively set depending on the magnitude of the voltage applied to individual gate electrodes 2, 2'.

The device may be typically driven through direct-current driving having a uniform potential direction between the source electrode and the drain electrode. However, in the case of the device including both the hole-transporting layer and the hole-transporting layer, among the light-emitting devices using transistor structures according to the example embodiments, AC driving may be applied. In the case of AC driving, the structure of the device is simple, thus facilitating the manufacture thereof.

According to a sixth example embodiment, in a light-emitting device using a transistor structure, a hole-transporting layer or an electron-transporting layer may include a barrier formed of an insulating material and adjoining the source electrode or drain electrode at the end opposite the direction of injection of holes or electrons thereof. Such a light-emitting device is illustrated in FIG. 7.

Figure 7:
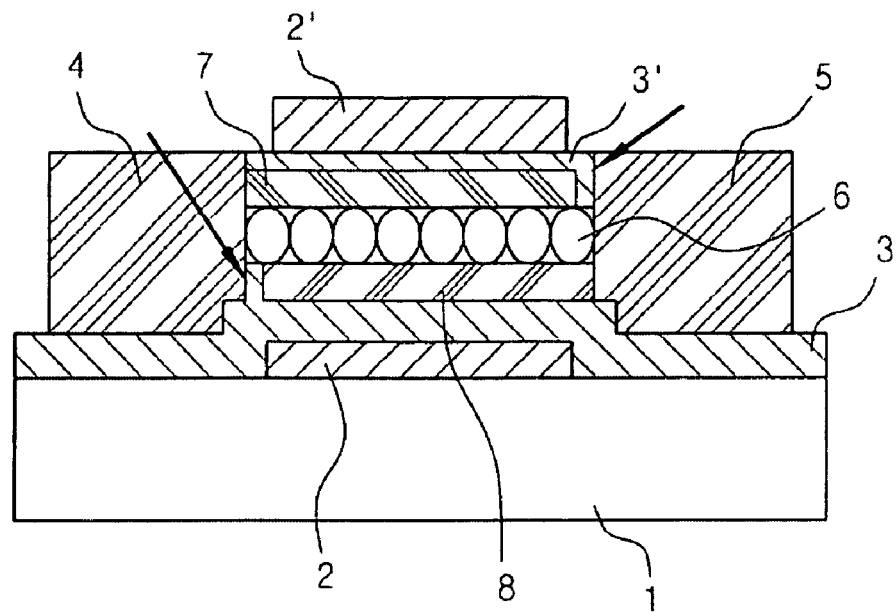

Referring to FIG. 7, in the light-emitting device using the transistor structure, which includes a substrate 1, a first gate electrode 2, a first insulating layer 3, a source electrode 4, and a drain electrode 5, a hole-transporting layer 8, a light-emitting layer 6, an electron-transporting layer 7, and a second insulating layer 3' may be sequentially formed between the source electrode 4 and the drain electrode 5 in a direction parallel to these electrodes, and a second gate electrode 2' may be formed on the second insulating layer 3'. Further, there are provided a barrier formed of an insulating material and adjoining the drain electrode 5 at the end opposite the direction of injection of electrons of the electron-transporting layer 7, and also a barrier formed of an insulating material and adjoining the source electrode 4 at the end opposite the direction of injection of holes of the hole-transporting layer 8. The barrier may be formed by extending the first insulating layer 3 or the second insulating layer 3' perpendicular to this layer, and is indicated by the arrow.

Figure 8:
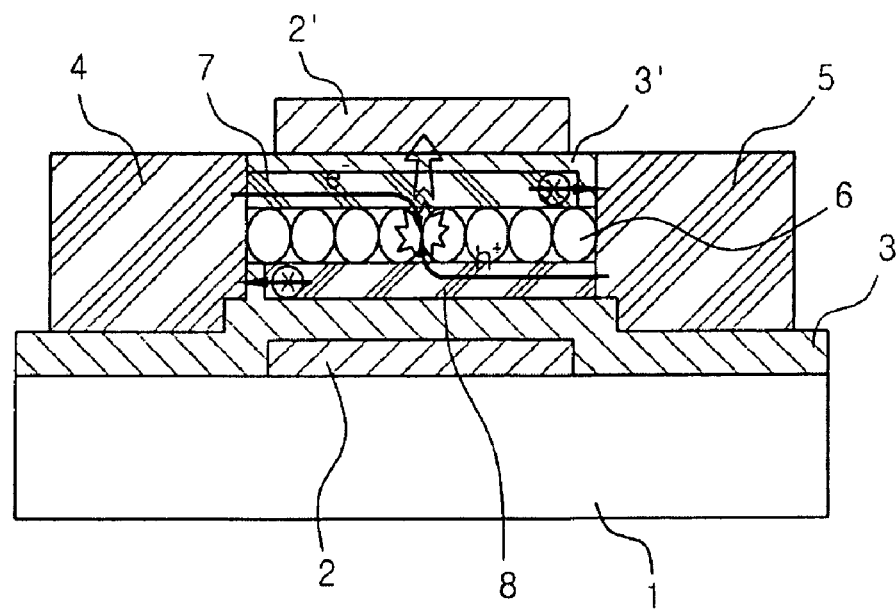

FIG. 8 illustrates the operation of the device of FIG. 7. In the case where one end of each of the electron-transporting layer 7 and the hole-transporting layer 8 is insulated from the source electrode 4 or the drain electrode 5 using an insulating material, a phenomenon in which excessive electrons or holes are discharged to the opposite electrode may be prevented, thereby increasing the light-emitting efficiency of the device.

In the case of the device including either the electron-transporting layer or the hole-transporting layer, among the light-emitting devices using transistor structures according to the example embodiments, the barrier may be formed using an insulating material at the portion adjoining the opposite electrode in the direction opposite the direction of injection of electrons or holes of the electron-transporting layer or hole-transporting layer, thus increasing the efficiency of the device. Such example embodiments are illustrated in FIGS. 9 and 10.

Figure 9:
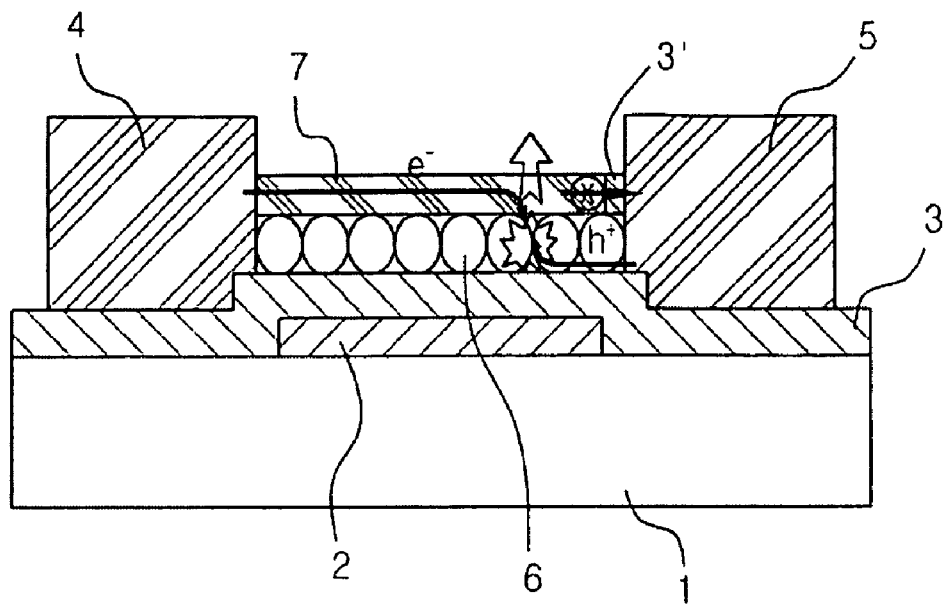
Figure 10:
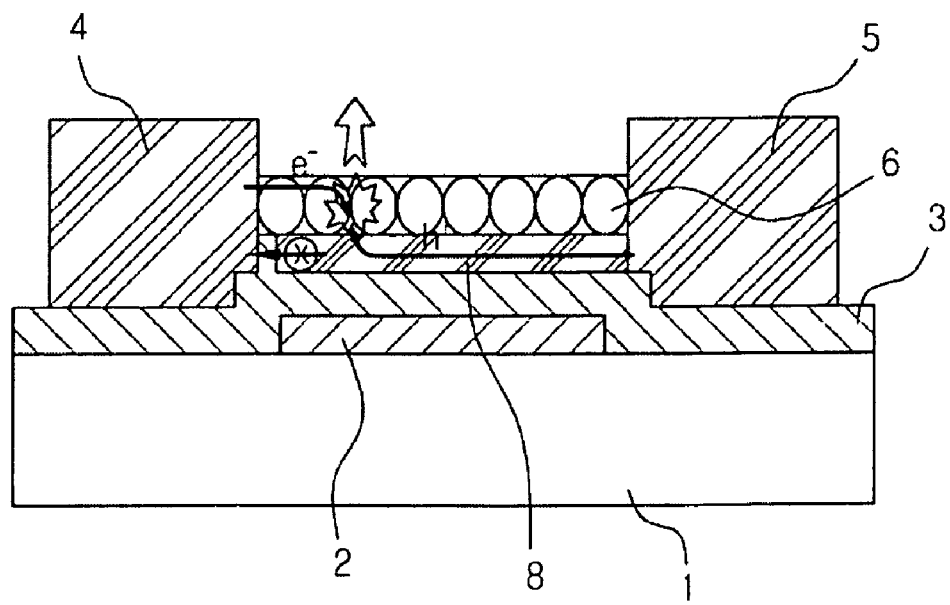

Referring to FIGS. 9 and 10, "x (arrow)" indicates that electrons or holes cannot be moved to the electron-injecting electrode or hole-injecting electrode and the source electrode 4 or drain electrode 5 opposite thereto, thereby decreasing leakage current, resulting in increased device efficiency.

The barrier may be integrated with the first insulating layer 3 or the second insulating layer 3'.

Any material for the first insulating layer 3 and the second insulating layer 3' of the light-emitting device using the transistor structure according to the example embodiments may be used without limitation as long as it is insulating material. Examples of inorganic insulating material include, but are not limited to, $SiO_2$, LiF, $BaF_2$, $TiO_2$, ZnO, SiC, $SnO_2$, $WO_3$, $ZrO_2$, $HfO_2$, $Ta_2O_5$, $BaTiO_3$, $BaZrO_3$, $Al_2O_3$, $Y_2O_3$, $ZrSiO_4$, $Si_3N_4$, TiN and mixtures thereof.

Alternatively, the first insulating layer 3 and the second insulating layer 3' may be formed of an organic insulating material, and examples of the organic insulating material include, but are not limited to, polymers, including epoxy resin and phenol resin, fatty acid monomers, including 3-(4-biphenylyl)-4-phenyl-5-tert-butylphenyl-1,2,4-triazole (TAZ), 3,4,5-triphenyl-1,2,4-triazole, 3,5-bis(4-tert-butylphenyl)-4-phenyl-1,2,4-triazole, arachidic acid and stearic acid, and mixtures thereof.

The light-emitting device using the transistor structure according to the example embodiments enables efficient electron injection and entire surface emission, and thereby may be effectively applied to an electronic device, including a display device, an illumination system, a backlight unit, and a surface emission device.

The light-emitting device using the transistor structure according to the example embodiments may exhibit light-receiving properties when a bias is changed, and therefore may be effectively applied as a light-receiving device, including a solar cell, a photodetector, and a sensor.

According to one example embodiment, in a light-receiving device using a transistor structure, which includes a substrate, a first gate electrode, a first insulating layer, a source electrode, and a drain electrode, a light-receiving layer may be formed between the source electrode and the drain electrode in a direction parallel to these electrodes.

According to another example embodiment, the light-receiving device using a transistor structure may further include an electron-transporting layer or a hole-transporting layer on the light-receiving layer.

According to a further example embodiment, the light-receiving device using a transistor structure may further include an electron-transporting layer or a hole-transporting layer formed between the first insulating layer and the light-receiving layer.

According to a still further example embodiment, the light-receiving device using a transistor structure may further include an electron-transporting layer or a hole-transporting layer at one side of the light-receiving layer, and also a hole-transporting layer or an electron-transporting layer between the first insulating layer and the light-emitting layer.

According to yet another example embodiment, the light-receiving device using a transistor structure may further include a second insulating layer formed on the electron-transporting layer or hole-transporting layer on the light-receiving layer, and a second gate electrode formed on the second insulating layer.

According to still another example embodiment, in the light-receiving device using a transistor structure, the hole-transporting layer or electron-transporting layer may include a barrier formed of insulating material and adjoining the source electrode or drain electrode at the end opposite the direction of injection of holes or electrons thereof.

As described hereinbefore, example embodiments provide a light-emitting device and a light-receiving device using a transistor structure. Such a light-emitting device has a structure in which a light-emitting layer, an electron-transporting layer, and a hole-transporting layer are formed as the channel portion of the transistor structure, in which electrons or holes may be injected from the source electrode or drain electrode in a direction parallel to these electrodes. As such, the magnitude of voltage that is applied to the gate electrode may be controlled without limitation as to the thickness or properties of the electron-transporting layer or hole-transporting layer, thereby adjusting the mobility of electrons or holes and removing overcurrent flowing in the circuit itself, consequently realizing stable circuit driving. Further, when the electric field of the gate electrode is changed, the light-emitting region may be selectively set. Therefore, the loss of the light-emitting material in a predetermined region may be reduced, thus increasing the lifespan of the device. The device according to the example embodiments may be formed directly on a conventional transistor device, and hence, the demand for circuits or chips additionally required for the driving of the device may be decreased. Moreover, in the case where quantum dots having excellent light-emitting efficiency and color purity are used as the material for the light-emitting layer, methods of increasing the efficiency may be simple, and economic benefits may be generated.

Although preferred example embodiments have been disclosed for illustrative purposes, those skilled in the art will appreciate that various modifications, additions and substitutions are possible, without departing from the scope and spirit of the accompanying claims.

What is claimed is:

1. A light-emitting device including a transistor structure, the light-emitting device comprising:
   a substrate;
   a first gate electrode;
   a first insulating layer;
   a source electrode;
   a drain electrode;
   a light-emitting layer formed between the source electrode and the drain electrode in a horizontal direction parallel to the source and drain electrodes; and
   an electron-transporting layer or a hole-transporting layer formed on the light-emitting layer wherein the hole-transporting layer or the electron-transporting layer has a barrier formed of an insulating material and adjoining the source electrode or the drain electrode at an end opposite a direction of injection of holes or electrons thereof.

2. The light-emitting device as set forth in claim 1, further comprising an electron-transporting layer or a hole-transporting layer formed between the first insulating layer and the light-emitting layer.

3. The light-emitting device as set forth in claim 1, wherein the electron-transporting layer is formed at one side of the light-emitting layer, and the hole-transporting layer is formed between the first insulating layer and the light-emitting layer.

4. The light-emitting device as set forth in claim 3, further comprising a second insulating layer formed on the electron-transporting layer on the light-emitting layer, and a second gate electrode formed on the second insulating layer.

5. The light-emitting device as set forth in claim 4, wherein the barrier is integrated with the first insulating layer or the second insulating layer.

6. The light-emitting device as set forth in claim 1, wherein the light-emitting layer is formed of an organic light-emitting material, the organic light-emitting material being selected from a group consisting of rubrene, anthracene, perylene, coumarin 6, Nile Red, aromatic diamine, TPD (N,N'-diphenyl-N,N'-bis-(3-methylphenyl)-1,1'-biphenyl-4,4'-diamine), DCM (dicyanomethylene-2-methyl-6-(p-dimethylaminostyryl) H-pyran) or derivatives thereof, polyparaphenylenevinylene-based derivatives, polythiophene-based derivatives, polyparaphenylene-based derivatives, and polyfluorene-based derivatives.

7. The light-emitting device as set forth in claim 1, wherein the light-emitting layer is a quantum-dot light-emitting layer, the quantum-dot light-emitting layer comprising quantum dots selected from a group consisting of Group II-VI compound semiconductor nanocrystals, Group III-V compound semiconductor nanocrystals, Group IV-VI compound semiconductor nanocrystals, Group IV compound semiconductor nanocrystals, and mixtures thereof.

8. The light-emitting device as set forth in claim 1, wherein the light-emitting layer comprises a mixture of quantum dots and bipolar material.

9. The light-emitting device as set forth in claim 8, wherein the bipolar material comprises a material selected from a group consisting of bipolar monomers, including copper phthalocyanine, and bipolar polymers, including polyaniline.

10. An electronic device, comprising a light-emitting device including a transistor structure, wherein the light-emitting device comprises:
 a substrate;
 a first gate electrode;
 a first insulating layer;
 a source electrode;
 a drain electrode;
 a light-emitting layer formed between the source electrode and the drain electrode in a direction parallel to the source and drain electrodes; and
 an electron-transporting layer or a hole-transporting layer formed on the light-emitting layer, wherein the hole-transporting layer or the electron-transporting layer has a barrier formed of an insulating material and adjoining the source electrode or the drain electrode at an end opposite a direction of injection of holes or electrons thereof.

11. The electronic device as set forth in claim 10, wherein the electronic device is a display device, an illumination system, a backlight unit, or a surface emission device.

12. A light-receiving device including a transistor structure, the light-receiving device comprising:
 a substrate;
 a first gate electrode;
 a first insulating layer;
 a source electrode;
 a drain electrode;
 a light-receiving layer formed between the source electrode and the drain electrode in a horizontal direction parallel to the source and drain electrodes;
 an electron-transporting layer or a hole-transporting layer formed on the light-receiving layer wherein the hole-transporting layer or the electron-transporting layer has a barrier formed of an insulating material and adjoining the source electrode or the drain electrode at an end opposite a direction of injection of holes or electrons thereof.

13. The light-receiving device as set forth in claim 12, further comprising an electron-transporting layer or a hole-transporting layer formed between the first insulating layer and the light-receiving layer.

14. The light-receiving device as set forth in claim 12, wherein the electron-transporting layer is formed at one side of the light-receiving layer, and the hole-transporting layer is formed between the first insulating layer and the light-receiving layer.

15. The light-receiving device as set forth in claim 14, further comprising a second insulating layer formed on the electron-transporting layer on the light-receiving layer, and a second gate electrode formed on the second insulating layer.

16. The light-receiving device as set forth in claim 12, wherein the light-receiving device is a solar cell, a photodetector, or a sensor.

* * * * *